(12) United States Patent
Park et al.

(10) Patent No.: US 9,117,798 B2
(45) Date of Patent: Aug. 25, 2015

(54) THIN FILM TRANSISTOR, METHOD OF FABRICATING THE SAME AND ORGANIC LIGHT EMITTING DIODE DISPLAY DEVICE INCLUDING THE SAME

(75) Inventors: Byoung-Keon Park, Yongin (KR); Tae-Hoon Yang, Yongin (KR); Jin-Wook Seo, Yongin (KR); Ki-Yong Lee, Yongin (KR); Hyun-Gue Kim, Yongin (KR); Maxim Lisachenko, Yongin (KR); Dong-Hyun Lee, Yongin (KR); Kil-Won Lee, Yongin (KR); Jong-Ryuk Park, Yongin (KR); Bo-Kyung Choi, Yongin (KR)

(73) Assignee: Samsung Display Co., Ltd., Yongin (KR)

( * ) Notice: Subject to any disclaimer, the term of this patent is extended or adjusted under 35 U.S.C. 154(b) by 1105 days.

(21) Appl. No.: 12/714,137

(22) Filed: Feb. 26, 2010

(65) Prior Publication Data

US 2010/0244036 A1 Sep. 30, 2010

(30) Foreign Application Priority Data

Mar. 27, 2009 (KR) .................. 10-2009-0026537

(51) Int. Cl.
*H01L 29/04* (2006.01)
*H01L 29/423* (2006.01)
(Continued)

(52) U.S. Cl.
CPC .... *H01L 29/42384* (2013.01); *H01L 29/66757* (2013.01); *H01L 29/78627* (2013.01); *H01L 27/1248* (2013.01); *H01L 27/3262* (2013.01)

(58) Field of Classification Search
USPC ....................... 257/40, 59, 72, 347
See application file for complete search history.

(56) References Cited

U.S. PATENT DOCUMENTS 5,517,037 A 5/1996 Yamamoto
5,814,540 A 9/1998 Takemura et al.
(Continued)

FOREIGN PATENT DOCUMENTS

CN 1779985 5/2006
EP 0763765 3/1997
(Continued)

OTHER PUBLICATIONS

English-language abstract of Japanese Patent Publication No. 11-02525.

(Continued)

*Primary Examiner* — Ori Nadav
(74) *Attorney, Agent, or Firm* — H.C. Park & Associates, PLC

(57) ABSTRACT

A thin film transistor, a method of fabricating the same, and an organic light emitting diode (OLED) display device including the same. The thin film transistor includes a substrate; a semiconductor layer disposed on the substrate and including a channel region; source/drain regions including ions and an offset region; a gate insulating layer disposed on the semiconductor layer; a gate electrode disposed on the gate insulating layer; a first insulating layer disposed on the gate electrode; a second insulating layer disposed on the first insulating layer; and source/drain electrodes disposed on the second insulating layer, and electrically connected to the source/drain regions of the semiconductor layer, respectively. The sum of thicknesses of the gate insulating layer and the first insulating layer that are on the source/drain regions is less than the vertical dispersion depth of the ions included in the source/drain regions.

9 Claims, 3 Drawing Sheets

(51) Int. Cl.
  *H01L 29/66* (2006.01)
  *H01L 29/786* (2006.01)
  *H01L 27/32* (2006.01)
  *H01L 27/12* (2006.01)

(56) References Cited

U.S. PATENT DOCUMENTS

| | | | |
|---|---|---|---|
| 5,818,083 | A | 10/1998 | Ito |
| 6,198,133 | B1 | 3/2001 | Yamazaki et al. |
| 6,294,442 | B1 | 9/2001 | Kamal |
| 6,294,815 | B1 | 9/2001 | Yamazaki et al. |
| 6,703,266 | B1 | 3/2004 | Chen et al. |
| 6,806,099 | B2 | 10/2004 | Takeda et al. |
| 6,812,473 | B1 | 11/2004 | Amemiya |
| 6,927,107 | B1 | 8/2005 | Makita et al. |
| 7,015,501 | B2 * | 3/2006 | Redecker et al. ............... 257/40 |
| 7,091,519 | B2 | 8/2006 | Yamazaki et al. |
| 7,341,907 | B2 | 3/2008 | Li et al. |
| 7,615,421 | B2 | 11/2009 | Lee et al. |
| 7,618,852 | B2 | 11/2009 | Jang et al. |
| 2001/0003659 | A1 | 6/2001 | Aya et al. |
| 2002/0063261 | A1 | 5/2002 | Zhang |
| 2003/0080337 | A1 | 5/2003 | Yudasaka et al. |
| 2004/0004597 | A1 | 1/2004 | Kung et al. |
| 2004/0115906 | A1 | 6/2004 | Makita et al. |
| 2004/0173796 | A1 | 9/2004 | Miyasaka |
| 2005/0023531 | A1 | 2/2005 | Shoji et al. |
| 2005/0161742 | A1 | 7/2005 | Isobe et al. |
| 2005/0184290 | A1 | 8/2005 | Ohnuma |
| 2005/0275019 | A1 | 12/2005 | Seo et al. |
| 2006/0033107 | A1 | 2/2006 | Lee et al. |
| 2006/0040429 | A1 | 2/2006 | Park et al. |
| 2006/0051914 | A1 | 3/2006 | Kakehata et al. |
| 2006/0061266 | A1 | 3/2006 | Kang et al. |
| 2006/0121651 | A1 | 6/2006 | Park et al. |
| 2006/0130939 | A1 | 6/2006 | Jang et al. |
| 2007/0238229 | A1 | 10/2007 | Chang et al. |
| 2008/0111135 | A1 | 5/2008 | Choi et al. |
| 2008/0157083 | A1 | 7/2008 | Park et al. |
| 2008/0211024 | A1 | 9/2008 | Kato et al. |
| 2008/0258186 | A1 | 10/2008 | Surdeanu et al. |
| 2009/0050894 | A1 | 2/2009 | Park et al. |
| 2009/0239352 | A1 | 9/2009 | Kitagawa et al. |

FOREIGN PATENT DOCUMENTS

| | | |
|---|---|---|
| EP | 1903604 A2 | 3/2008 |
| EP | 2226833 A1 | 9/2010 |
| JP | 63-033868 | 2/1988 |
| JP | 63-304668 | 12/1988 |
| JP | 05-173177 | 7/1993 |
| JP | 06-067203 | 3/1994 |
| JP | 06-260651 | 9/1994 |
| JP | 07-013196 | 1/1995 |
| JP | 08-045850 | 2/1996 |
| JP | 09-107100 | 4/1997 |
| JP | 2001-189275 | 7/2001 |
| JP | 2001-337348 | 12/2001 |
| JP | 2003-060209 | 2/2003 |
| JP | 2003-100629 | 4/2003 |
| JP | 2003-115457 | 4/2003 |
| JP | 2003-188098 | 7/2003 |
| JP | 2004-207298 | 7/2004 |
| JP | 2005-064487 | 3/2005 |
| JP | 2005-229096 | 8/2005 |
| JP | 2005-354028 | 12/2005 |
| JP | 2006-019682 | 1/2006 |
| JP | 2006-024881 | 1/2006 |
| JP | 2006-330736 | 12/2006 |
| JP | 2007-013145 | 1/2007 |
| JP | 2007-027202 | 2/2007 |
| JP | 2007-035812 | 2/2007 |
| JP | 2007-073953 | 3/2007 |
| JP | 2007-193313 | 8/2007 |
| JP | 2007-311767 | 11/2007 |
| JP | 2008-166698 | 7/2008 |
| JP | 2008-166703 | 7/2008 |
| JP | 2008-166785 | 7/2008 |
| JP | 2009-059940 | 3/2009 |
| KR | 1992-0006076 | 7/1992 |
| KR | 10-1997-0072491 | 7/1997 |
| KR | 10-1997-0063763 | 9/1997 |
| KR | 10-2000-0055877 | 9/2000 |
| KR | 10-0285865 | 3/2001 |
| KR | 10-2001-0078788 | 8/2001 |
| KR | 10-0317638 | 12/2001 |
| KR | 10-2002-0021546 | 3/2002 |
| KR | 10-2003-0028696 | 4/2003 |
| KR | 10-2004-0035409 | 4/2004 |
| KR | 10-2004-0036761 | 5/2004 |
| KR | 10-2004-0040762 | 5/2004 |
| KR | 10-2004-0098958 A | 11/2004 |
| KR | 10-0470274 | 2/2005 |
| KR | 10-2006-0018533 | 3/2006 |
| KR | 1020060058934 | 6/2006 |
| KR | 10-0623228 | 9/2006 |
| KR | 10-0628989 | 9/2006 |
| KR | 10-0772347 | 10/2007 |
| KR | 10-2007-0107142 | 11/2007 |
| KR | 10-2007-0107168 | 11/2007 |
| KR | 10-0778781 | 11/2007 |
| KR | 10-0839735 | 6/2008 |
| KR | 10-2008-0086967 | 9/2008 |
| TW | 361694 | 6/1999 |
| TW | I296855 | 5/2008 |
| TW | I305681 | 1/2009 |
| TW | I307961 | 3/2009 |

OTHER PUBLICATIONS

Soo Young Yoon et al., "*Metal-induced crystallization of amorphous silicon,*" Thin Solid Films 383 (2001), pp. 34-38.
U.S. Appl. No. 12/714,201, filed Feb. 26, 2010, Byoung-keon Park et al., Samsung Mobile Display Co., Ltd.
U.S. Appl. No. 12/713,846, filed Feb. 26, 2010, Byoung-keon Park et al., Samsung Mobile Display Co., Ltd.
U.S. Appl. No. 12/712,591, filed Feb. 25, 2010, Dong-hyun Lee et al., Samsung Mobile Display Co., Ltd.
U.S. Appl. No. 12/714,252, filed Feb. 26, 2010, Yun-mo Chung et al., Samsung Mobile Display Co., Ltd.
U.S. Appl. No. 12/713,928, filed Feb. 26, 2010, Kit-won Lee et al., Samsung Mobile Display Co., Ltd.
U.S. Appl. No. 12/714,154, filed Feb. 26, 2010, Dong-hyun Lee et al., Samsung Mobile Display Co., Ltd.
Notice of Allowance of U.S. Appl. No. 12/714,252 issued on Aug. 30, 2011.
US Office Action dated Nov. 8, 2010, issued in corresponding U.S. Appl. No. 12/714,252.
Ex Parte Quayle Action dated May 9, 2011 with regard to related U.S. Appl. No. 12/714,252.
S.L. Gras, et al., Intelligent Control of Surface Hydrophobicity, pp. 2036- 2050, ChemphyChem, vol. 8, Oct. 2007, Wiley-VCH, Germany.
Non-Final Office Action of U.S. Appl. No. 12/714,201 dated on Jan. 13, 2012.
Non-Final Office Action of related U.S. Appl. No. 12/714,154 dated Dec. 23, 2011.
Non-Final Office Action of related U.S. Appl. No. 12/713,846 issued Aug. 27, 2012.
Final Office Action of U.S. Appl. No. 12/713,928 dated on Jul. 10, 2012.
Non-Final Office Action of U.S. Appl. No. 12/713,928 dated on Mar. 28, 2012.
Final Office Action of U.S. Appl. No. 12/714,154 dated on Apr. 10, 2012.
Final Office Action of U.S. Appl. No. 12/714,201 dated on Apr. 24, 2012.
Notice of Allowance issued Jan. 22, 2015, in U.S. Appl. No. 13/841,121.

(56) References Cited

OTHER PUBLICATIONS

Final Office Action issued on Oct. 17, 2013 in U.S. Appl. No. 12/714,154.
Non-Final Office Action issued on Feb. 26, 2014 in U.S. Appl. No. 12/714,154.
Non-Final Office Action U.S. Appl. No. 13/841,121 dated Sep. 30, 2014.
Non-Final Office Action dated Dec. 3, 2013 in U.S. Appl. No. 12/714,201.
Notice of Allowance U.S. Appl. No. 12/713,846 dated on Dec. 14, 2012.
European Extended Search Report issued on Mar. 4, 2014 in European Application No. 10154502.8.
Notice of Allowance issued on May 24, 2013 in U.S. Appl. No. 13/177,936.
Non-Final Office Action issued on Jul. 5, 2013 in U.S. Appl. No. 12/714,154.
Final Office Action issued on Jul. 24, 2013 in U.S. Appl. No. 12/712,591.
Final Office Action of U.S. Appl. No. 12/714,201 dated Jan. 17, 2013.
Final Office Action of U.S. Appl. No. 12/713,928 dated Sep. 20, 2012.
Non-Final Office Action of U.S. Appl. No. 12/714,201 dated Sep. 27, 2012.
Non-Final Office Action of related U.S. Appl. No. 12/712,591 mailed on Feb. 28, 2013.
Final Office Action issued on Mar. 12, 2014 in U.S. Appl. No. 12/714,201.
Non-Final Office Action issued on Jun. 25, 2015, in U.S. Appl. No. 12/712,591.

* cited by examiner

THIN FILM TRANSISTOR, METHOD OF FABRICATING THE SAME AND ORGANIC LIGHT EMITTING DIODE DISPLAY DEVICE INCLUDING THE SAME

CROSS-REFERENCE TO RELATED APPLICATION

This application claims the benefit of Korean Application No. 10-2009-0026537, filed Mar. 27, 2009 in the Korean Intellectual Property Office, the disclosure of which is incorporated herein by reference.

BACKGROUND OF THE INVENTION

1. Field of the Invention

Aspects of the present invention relate to a thin film transistor, a method of fabricating the same, and an organic light emitting diode (OLED) display device including the thin film transistor. More particularly, aspects of the present invention relate to a thin film transistor in which a first insulating layer is formed with a predetermined thickness on a gate electrode, followed by ion doping. In this way, an offset region may be formed aligned with the gate electrode without a need for an additional spacer, and the thickness of the first insulating layer can be varied to facilitate adjustment of the width of the offset region. Additional aspects of the present invention include a method of fabricating the thin film transistor, as well as an OLED display device using the same.

2. Description of the Related Art

In general, polysilicon layers are widely used as semiconductor layers of thin film transistors because of the layers' high field effect mobility and applicability to high-speed operating circuits and CMOS circuits. A thin film transistor using a polysilicon layer may generally be used as an active element of an active matrix liquid crystal display (AMLCD), and a switching element and a driving element of an organic light emitting diode (OLED).

In a thin film transistor using such a polysilicon layer, ion doping may be performed on predetermined regions of the polysilicon layer to form source/drain regions. Here, strong electric fields may be formed at interfaces between channel regions on which ion doping is not performed and drain regions on which ion doping is performed to generate leakage currents or hot carriers, and the generated currents may move towards the channel, causing performance characteristics of a device to degrade.

In order to overcome such drawbacks, a method of forming a low-concentration doping region or an offset region between the channel region and the source/drain regions has been proposed. A conventional method of forming an offset region may include forming a spacer on a lateral surface of a gate electrode and then ion doping on the structure. The spacer may be created by forming an insulating layer on the gate electrode and patterning the resulting structure or by performing anodic oxidation. However, in order to form the spacer using these methods, an additional mask and a photo process for patterning may be required or the manufacturing processes may be more complex because of the anodic oxidation process.

SUMMARY OF THE INVENTION

Aspects of the present invention provide a thin film transistor made with simplified processes and then facilitating adjustment of the width of an offset region when the offset region is formed on a semiconductor layer. Aspects of the present method also provide a method of fabricating the same, and an organic light emitting diode (OLED) display device including the same.

In an exemplary embodiment of the present invention, a thin film transistor includes: a substrate; a semiconductor layer disposed on the substrate and including a channel region, source/drain regions including ions and an offset region; a gate insulating layer disposed on the semiconductor layer; a gate electrode disposed on the gate insulating layer; a first insulating layer disposed on the gate electrode; a second insulating layer disposed on the first insulating layer; and source/drain electrodes disposed on the second insulating layer and electrically connected to the source/drain regions of the semiconductor layer, respectively. The sum of thicknesses of the gate insulating layer and the first insulating layer that are on the source/drain regions is less than the vertical dispersion depth of the ions included in the source/drain regions.

In another exemplary embodiment of the present invention, a method of fabricating a thin film transistor includes: forming a polysilicon layer pattern on a substrate; forming a gate insulating layer on the polysilicon layer pattern; forming a gate electrode on the gate insulating layer, and a first insulating layer on the gate electrode; implanting ions into the polysilicon layer pattern on the first insulating layer to form a semiconductor layer including a channel region, source/drain regions and an offset region; forming a second insulating layer on the first insulating layer; and forming source/drain electrodes electrically connected to the source/drain regions of the semiconductor layer, respectively, on the second insulating layer. The sum of thicknesses of the gate insulating layer and the first insulating layer disposed on the source/drain regions is less than the vertical penetration depth of the ions included in the source/drain regions.

In still another exemplary embodiment of the present invention, an organic light emitting diode (OLED) display device includes: a substrate; a semiconductor layer disposed on the substrate, and including a channel region, source/drain regions and an offset region; a gate insulating layer disposed on the semiconductor layer; a gate electrode disposed on the gate insulating layer; a first insulating layer disposed on the gate electrode; a second insulating layer disposed on the first insulating layer; source/drain electrodes disposed on the second insulating layer and electrically connected to the source/drain regions of the semiconductor layer, respectively; a first electrode electrically connected to one of the source/drain electrodes; an organic layer disposed on the first electrode and including an emission layer; and a second electrode disposed on the organic layer. The sum of thicknesses of the gate insulating layer and the first insulating layer that are on the source/drain regions is less than the vertical penetration depth of the ions included in the source/drain regions.

Additional aspects and/or advantages of the invention will be set forth in part in the description which follows and, in part, will be obvious from the description, or may be learned by practice of the invention.

BRIEF DESCRIPTION OF THE DRAWINGS

These and/or other aspects and advantages of the invention will become apparent and more readily appreciated from the following description of the embodiments, taken in conjunction with the accompanying drawings of which.

DETAILED DESCRIPTION OF THE EMBODIMENTS

Figure 1:
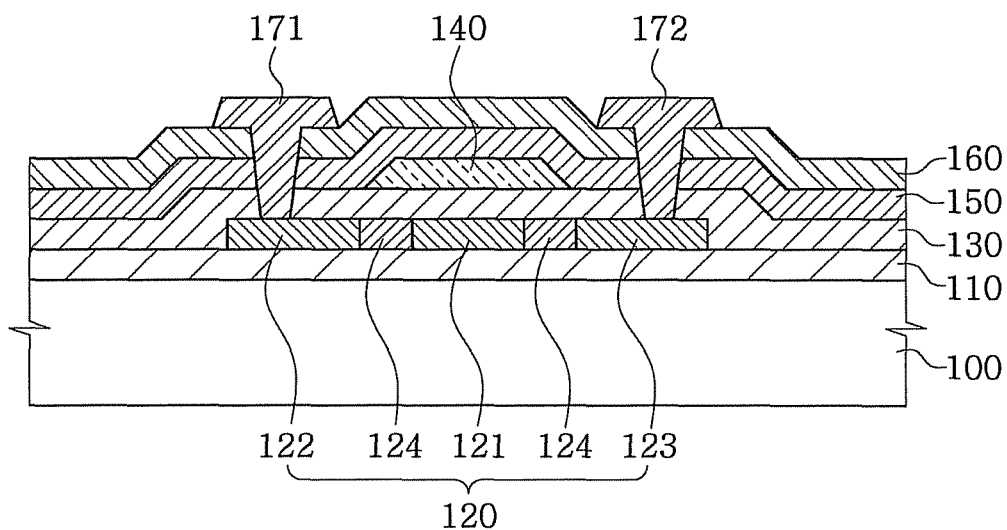
FIG. 1 is a cross-sectional view of a thin film transistor according to an exemplary embodiment of the present invention.

Reference will now be made in detail to the present embodiments of the present invention, examples of which are illustrated in the accompanying drawings, wherein like reference numerals refer to the like elements throughout. The embodiments are described below in order to explain the present invention by referring to the figures. Moreover, it is to be understood that where is stated herein that one layer is "formed on" or "disposed on" a second layer, the first layer may be formed or disposed directly on the second layer or there may be an intervening layer between the first layer and the second layer. Further, as used herein, the term "formed on" is used with the same meaning as "located on" or "disposed on" and is not meant to be limiting regarding any particular fabrication process.

FIG. 1 is a cross-sectional view of a thin film transistor according an exemplary embodiment of the present invention. A buffer layer 110 may be disposed on a substrate 100 that has been formed of glass or plastic. The buffer layer 110 may be formed of a single silicon dioxide layer or silicon nitride layer or a combination thereof.

A semiconductor layer 120 including a channel region 121, source/drain regions 122 and 123, and an offset region 124 is disposed on the buffer layer 110. The semiconductor layer 120 is formed of a polysilicon layer. The source/drain regions 122 and 123 include n- or p-type ions. The p-type ion may be an ion formed from an element selected from the group consisting of boron (B), aluminum (Al), gallium (Ga) and indium (In), and the n-type ion may be an ion formed from an element selected from the group consisting of phosphorus (P), arsenic (As) and antimony (Sb).

A gate insulating layer 130 is disposed on the semiconductor layer 120. The gate insulating layer 130 may be formed of a silicon dioxide layer, a silicon nitride layer or a combination thereof. The gate insulating layer 130 disposed on the source/drain regions 122 and 123 and the offset region 124 may be thinner than the gate insulating layer 130 disposed below a gate electrode 140, and the difference in the thicknesses may be 200 to 300 Å. The gate insulating layer 130 may be formed to a thickness of 500 to 1500 Å.

The gate electrode 140 is disposed on the gate insulating layer 130. The gate electrode 140 is disposed to correspond to the channel region 121 of the semiconductor layer 120. Ends of the gate electrode 140 may have taper angles in the range of 40 to less than 90 degrees. After a first insulating layer 150 is formed on the gate electrode 140, ion doping is performed on the semiconductor layer 120 to form the offset region 124 in the semiconductor layer 120. In this case, when the gate electrode 140 has a taper angle below 40 degrees, the offset region 124 may not be aligned with the gate electrode 140. Alternatively, when the gate electrode 140 has a taper angle of 90 degrees or higher, the first insulating layer 150 on the gate electrode 140 may exhibit poor step coverage, and thus the formed offset region 124 may have a high dispersion. The gate electrode 140 may be formed of a single layer of aluminum (Al) or an aluminum alloy such as aluminum-neodymium (Al—Nd) or a combination layer in which an aluminum alloy is stacked on a chrome (Cr) or molybdenum (Mo) alloy.

The first insulating layer 150 is disposed on the gate electrode 140. The first insulating layer 150 is intended for forming the offset region. After the first insulating layer 150 is formed, ions are implanted into the semiconductor layer 120 through the first insulating layer 150 and the gate insulating layer 130, and thus the first insulating layer 150 may include the same ions as those in the source/drain regions 122 and 123 of the semiconductor layer 120.

The sum of thicknesses of the gate insulating layer 130 disposed on the source/drain regions 122 and 123 and the first insulating layer 150 may be less than the vertical penetration depth of the ions included in the source/drain regions 122 and 123. More specifically, when p-type ions are implanted into the source/drain regions 122 and 123, the sum of thicknesses of the gate insulating layer 130 disposed on the source/drain regions 122 and 123 and the first insulating layer 150 may be less than 1700 Å. When n-type ions are implanted into the source/drain regions 122 and 123, the sum of thicknesses of the gate insulating layer 130 disposed on the source/drain regions 122 and 123 and the first insulating layer 150 may be less than 1300 Å. Considering that the lateral diffusion distance of the ions implanted into the source/drain regions 122 and 123 is 300 to 400 Å, the first insulating layer 150 may be formed to a thickness of 500 Å or greater. The first insulating layer 150 may be formed of a silicon dioxide layer, a silicon nitride layer or a combination thereof.

A second insulating layer 160 is disposed on the first insulating layer 150. The second insulating layer 160 is formed after ions are implanted into the semiconductor layer 120. Unlike the first insulating layer 150, the second insulating layer 160 does not include the same ions as those in the source/drain regions 122 and 123 of the semiconductor layer 120. The second insulating layer 160 may be formed of a silicon nitride layer, a silicon dioxide layer or a combination thereof.

Source/drain electrodes 171 and 172 electrically connected to the source/drain regions 122 and 123 of the semiconductor layer 120 are formed on the second insulating layer 160. The source/drain electrodes 171 and 172 may be formed of a metal or alloy selected from the group consisting of molybdenum (Mo), chrome (Cr), tungsten (W), aluminum-neodymium (Al—Nd), titanium (Ti), molybdenum-tungsten (Mo—W), and aluminum (Al).

Figure 2A:
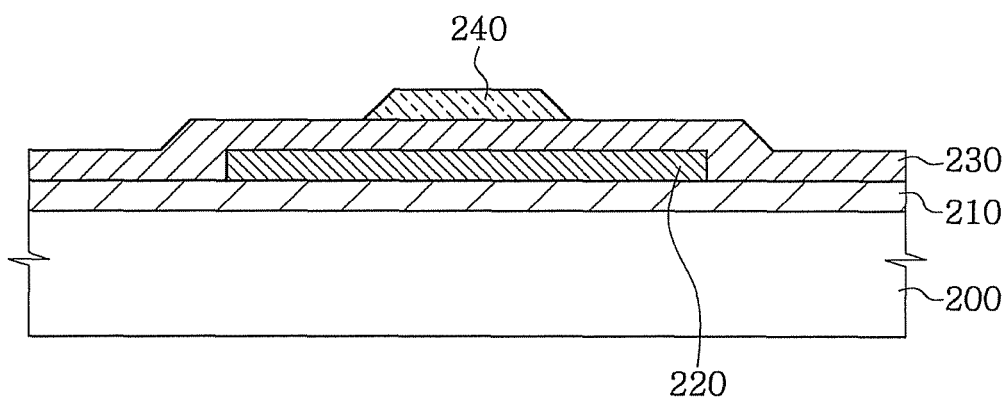
FIGS. 2A to 2C are cross-sectional views illustrating a process of fabricating a thin film transistor according to another exemplary embodiment of the present invention.
Figure 2B:
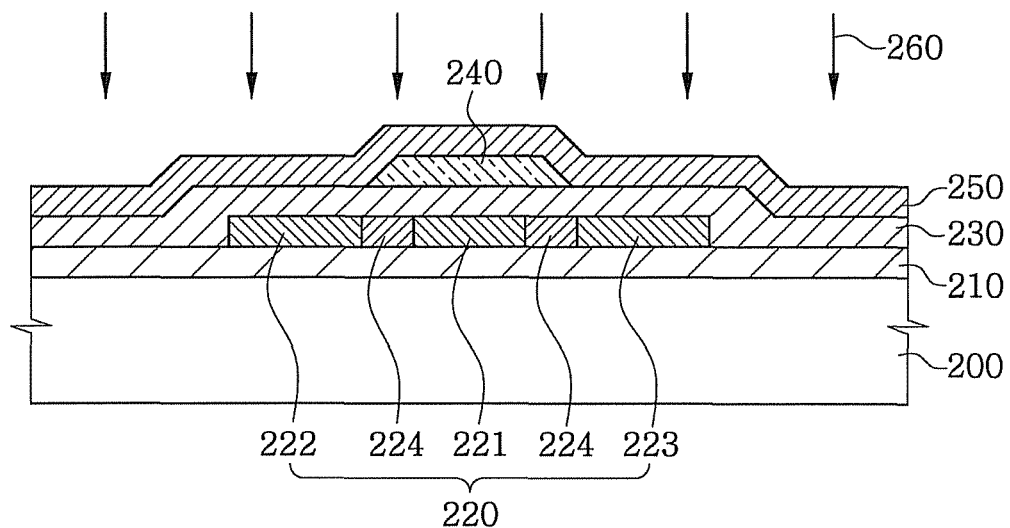
Figure 2C:
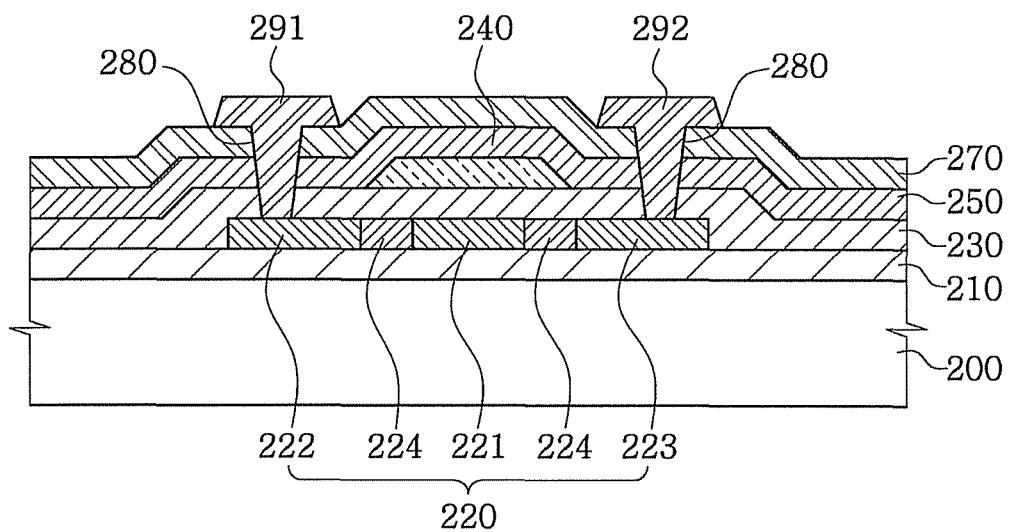

FIGS. 2A to 2C are cross-sectional views illustrating a process of fabricating a thin film transistor according to another exemplary embodiment of the present invention. First, as illustrated in FIG. 2A, a buffer layer 210 is formed on a substrate 200 formed of glass or plastic. The buffer layer 210 may be formed of a single insulating layer such as a silicon dioxide layer or a silicon nitride layer or a combination thereof using chemical vapor deposition or physical vapor deposition. Here, the buffer layer 210 functions to prevent the diffusion of moisture or impurities from the substrate 200 or adjust a heat transfer rate in crystallization to facilitate crystallization of an amorphous silicon layer.

Subsequently, a polysilicon layer is formed on the buffer layer 210, and then patterned to form a polysilicon layer pattern 220. After an amorphous silicon layer is formed, the polysilicon layer may be crystallized by rapid thermal annealing (RTA), solid phase crystallization (SPC), excimer laser crystallization (ELA), metal induced crystallization (MIC), metal induced lateral crystallization (MILC), sequential lateral solidification (SLS), or super grain silicon (SGS).

Then, a gate insulating layer 230 is formed on the substrate 200 where the polysilicon layer pattern 220 is formed. Here, the gate insulating layer 230 may be formed of a silicon dioxide layer, a silicon nitride layer or a combination thereof. The gate insulating layer may be formed to a thickness of 500 to 1500 Å

Sequentially, a single layer of aluminum (Al) or an aluminum alloy such as aluminum-neodymium (Al—Nd) or a multilayer in which an aluminum alloy is stacked on a chrome or molybdenum alloy is formed as a metal layer for a gate electrode 240, and the gate electrode metal layer (not separately shown) is etched using photolithography to form the gate electrode 240. An end portion of the gate electrode 240 may have a taper angle of 40 degrees to less than 90 degrees. When the gate electrode 240 has a taper angle of less than 40 degrees, the offset region 224 may not be entirely aligned with the gate electrode 240. When the gate electrode 240 has a taper angle of 90 degrees or greater, the first insulating layer 250 on the gate electrode 240 may exhibit poor step coverage, and thus the formed offset region 224 may have a high dispersion.

The gate electrode metal layer may be etched to partially etch the gate insulating layer 230 disposed on a region other than a region below the gate electrode 240 when the gate electrode 240 is formed. When the gate insulating layer 230 formed on a region other than a channel region 221 is excessively thick, the first insulating layer 250 formed in the following process must be formed thin. Since forming the first insulating layer 250 to be thin may be difficult, the gate insulating layer 230 may be partially etched such that the first insulating layer 250 is formed to an appropriate thickness. The thickness of the gate insulating layer 230 disposed below the gate electrode 240 may be different from that of the gate insulating layer 230 in regions other than the region below the gate electrode 240 by a thickness of 200 to 300 Å.

Subsequently, referring to FIG. 2B, the first insulating layer 250 is formed on the entire surface of the substrate 200 including the gate electrode 240. The first insulating layer 250 may be formed of a silicon nitride layer, a silicon dioxide layer or a combination thereof. Next, n- or p-type ions 260 are implanted into the polysilicon layer pattern 220 on the first insulating layer 250 to form a semiconductor layer including a channel region 221, source/drain regions 222 and 223 and an offset region 224. The p-type ions may be ions formed from elements selected from the group consisting of boron (B), gallium (Ga) and indium (In), and the n-type ions may be ions formed from elements selected from the group consisting of phosphorus (P), arsenic (As) and antimony (Sb). The ion implantation may be performed at an ion energy of 50 to 100 keV with a dose of $1 \times 10^{14}$ to $1 \times 10^{16}/cm^2$. When ion implantation is performed with a dose less than $1 \times 10^{14}/cm^2$, the formed source/drain regions 222 and 223 have an increased resistance, so that they may not function properly as source/drain regions. Alternatively, when ion implantation is performed with a dose exceeding $1 \times 10^{16}/cm^2$, the implanted ions may not be activated, and the source/drain regions may be amorphous, so that the desired characteristics may not be attained.

The first insulating layer 250 is intended for forming an offset region 224. Since after the first insulating layer 250 is formed, the ions are implanted into the polysilicon layer pattern 220 through the first insulating layer 250 and the gate insulating layer 230, the first insulating layer 250 may include the same ions as those in the source/drain regions 222 and 223 of the semiconductor layer.

The sum of thicknesses of the gate insulating layer 230 and the first insulating layer 250 that are disposed on the source/drain regions 222 and 223 may be less than the vertical penetration depth of the ions included in the source/drain regions. Specific descriptions thereof are provided below.

Tables 1 and 2 are results of simulating a vertical penetration depth and a horizontal dispersion distance as a function of ion energy when ion shower doping is performed. Table 1 illustrates the case of boron ions and Table 2 illustrates the case of phosphorus ions.

TABLE 1

| Ion Energy (keV) | Vertical Penetration Depth (Å) | Horizontal Dispersion Distance (Å) |
|---|---|---|
| 50 | 810 | 210 |
| 70 | 1152 | 287 |
| 90 | 1502 | 363 |
| 100 | 1679 | 401 |

TABLE 2

| Ion Energy (keV) | Vertical Penetration Depth (Å) | Horizontal Dispersion Distance (Å) |
|---|---|---|
| 50 | 646 | 162 |
| 70 | 898 | 215 |
| 90 | 1152 | 267 |
| 100 | 1284 | 292 |

When ion shower doping is performed, the ion energy generally used ranges up to 100 keV. Further, referring to Tables 1 and 2, when p-type ions such as boron are implanted into the source/drain regions 222 and 223, the sum of thicknesses of the gate insulating layer 230 and the first insulating layer 250 that are disposed on the source/drain regions 222 and 223 may less than 1700 Å. When n-type ions such as phosphorus are implanted into the source/drain regions 222 and 223, the sum of thicknesses of the gate insulating layer 230 and the first insulating layer 250 that are disposed on the source/drain regions 222 and 223 may be less than 1300 Å. Considering that the ions implanted into the source/drain regions 222 and 223 are laterally dispersed by a distance of 300 to 400 Å, the first insulating layer 250 may be formed to a thickness of 500 Å or greater.

Sequentially, referring to FIG. 2C, a second insulating layer 270 is formed on the first insulating layer 250. The second insulating layer 270 may be formed of a silicon nitride layer, a silicon dioxide layer or a combination thereof. The sum of thicknesses of the first insulating layer 250 and the second insulating layer 270 may be 4000 to 6000 Å.

Subsequently, predetermined regions of the gate insulating layer 230, the first insulating layer 250 and the second insulating layer 270 may be etched to form a contact hole 280 that exposes a predetermined region of the source/drain regions 222 and 223 of the semiconductor layer. Next, source/drain electrodes 291 and 292 are connected to the source/drain regions 222 and 223 through the contact hole 280. The source/drain electrodes 291 and 292 may be formed of a metal or alloy selected from the group consisting of molybdenum (Mo), chrome (Cr), tungsten (W), aluminum-neodymium (Al—Nd), titanium (Ti), molybdenum-tungsten (Mo—W), and aluminum (Al).

Figure 3:
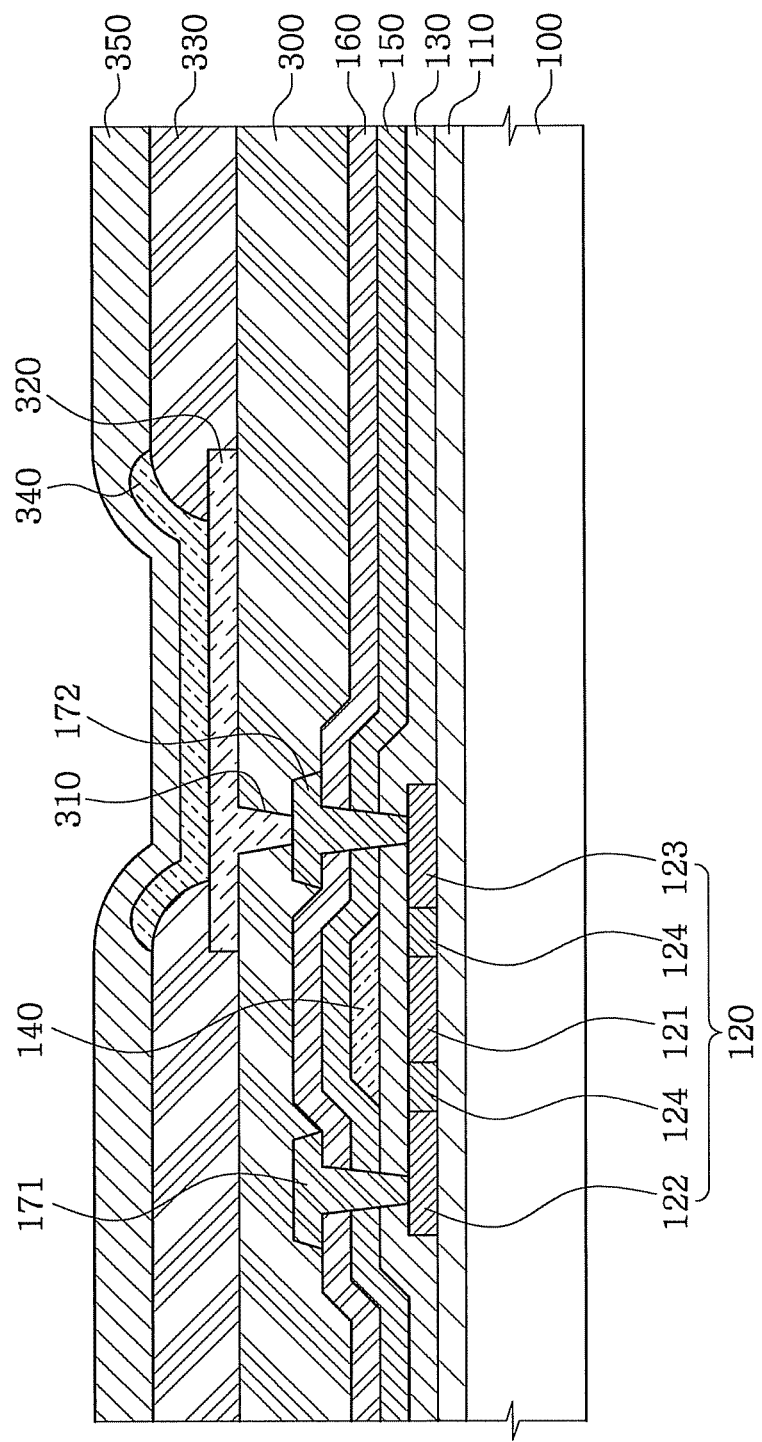
FIG. 3 is a cross-sectional view of an organic light emitting diode (OLED) display device according to another exemplary embodiment of the present invention.

FIG. 3 is a cross-sectional view of an OLED display device including a thin film transistor according to another exemplary embodiment of the present invention. In FIG. 3, reference numbers 100 through 172 have the same meaning as in FIG. 1 and will not be further described. Referring to FIG. 3, a third insulating layer 300 is disposed on the entire surface of the substrate 100 including the thin film transistor illustrated in FIG. 1 according to that exemplary embodiment of the present invention. The third insulating layer 300 may be formed of an inorganic material selected from the group consisting of a silicon dioxide layer, a silicon nitride layer and silicate on glass or an organic layer selected from the group consisting of polyimide, benzocyclobutene series resin and acrylate. Alternatively, the insulating layer 300 may be formed in a stacked structure of the inorganic layer and the organic layer.

A via hole 310 exposing one of the source/drain electrodes 171 and 172 is disposed in the third insulating layer 300. A first electrode 320 connected to one of the source/drain electrodes 171 and 172 through the via hole 310 is disposed on the third insulating layer 300. The first electrode 320 may be an anode or a cathode. When the first electrode 320 is an anode, the anode may be formed of a transparent conductive layer formed of one of ITO, IZO and ITZO. When the first electrode is a cathode, the cathode may be formed of Mg, Ca, Al, Ag, Ba or an alloy thereof.

Sequentially, a pixel defining layer 330 having an opening partially exposing a surface of the first electrode 320 is disposed on the first electrode 320, and an organic layer 340 including an emission layer is disposed on the first electrode 320. The organic layer 340 may include at least one layer selected from the group consisting of a hole injection layer, a hole transport layer, a hole blocking layer, an electron blocking layer, an electron injection layer and an electron transport layer. Then, a second electrode 350 is disposed on the organic layer 340.

Therefore, in aspects of the present invention, the first insulating layer formed to a predetermined thickness is formed on the gate electrode, and ion doping is performed, so that the offset region may be formed to be aligned with the gate electrode. Further, a mask and a photo process for forming a spacer for forming the offset region are not additionally required, so that the process is simplified. The thickness of the first insulating layer is adjusted to facilitate adjustment of the width of the offset region.

Although a few embodiments of the present invention have been shown and described, it would be appreciated by those skilled in the art that changes may be made in this embodiment without departing from the principles and spirit of the invention, the scope of which is defined in the claims and their equivalents.

What is claimed is:

1. An organic light emitting diode (OLED) display device, comprising:
   a substrate;
   a semiconductor layer disposed on the substrate, and comprising a channel region, source and drain regions, and an offset region;
   a gate insulating layer disposed on the semiconductor layer;
   a gate electrode disposed on the gate insulating layer;
   a first insulating layer disposed on the gate electrode;
   a second insulating layer disposed on the first insulating layer;
   source and drain electrodes disposed on the second insulating layer, and electrically connected to the source and drain regions of the semiconductor layer, respectively;
   a first electrode electrically connected to one of the source and drain electrodes;
   an organic layer disposed on the first electrode and comprising an emission layer; and
   a second electrode disposed on the organic layer,
   wherein a sum of thicknesses of portions of the gate insulating layer and the first insulating layer disposed on the source and drain regions is less than a vertical penetration depth of ions implanted in the source and drain regions.

2. The OLED display device of claim 1, wherein the source and drain regions comprise p-type ions, and the sum of thicknesses of the portions of the gate insulating layer and the first insulating layer disposed on the source and drain regions is less than 1700 Å.

3. The OLED display device of claim 1, wherein the source and drain regions comprise n-type ions, and the sum of thicknesses of the portions of the gate insulating layer and the first insulating layer disposed on the source and drain regions is less than 1300 Å.

4. The OLED display device of claim 1, further comprising a buffer layer disposed between the substrate and the semiconductor layer.

5. The OLED display device of claim 1, further comprising a third insulating layer disposed over the substrate, the semiconductor layer, the gate insulating layer, the gate electrode, the first insulating layer, the second insulating layer and the source and drain electrodes, wherein:
   the third insulating layer is at least one of an inorganic layer and an organic layer,
   the inorganic layer is formed of a material selected from the group consisting of silicon dioxide, silicon nitride, and silicate on glass, and
   the organic layer is a material selected from the group consisting of polyimide, benzocyclobutene series resin, and acrylate.

6. The OLED display device of claim 5, further comprising:
   a via hole disposed in the third insulating layer and exposing one of the source and drain electrodes,
   wherein the first electrode is disposed on the third insulating layer and is electrically connected to the one of the source and drain electrodes through the via hole.

7. The OLED display device of claim 6, further comprising:
   a pixel defining layer disposed on the first electrode and partially exposing a surface of the first electrode.

8. The OLED display device of claim 7, wherein the organic layer comprises at least one layer selected from the group consisting of a hole injection layer, a hole transport layer, a hole blocking layer, an electron blocking layer, an electron injection layer, and an electron transport layer.

9. The OLED display device of claim 1, wherein the first insulating layer comprises the same type of ions as the ions implanted in the source and drain regions, and the second insulating layer does not comprise the same type of ions as the ions implanted in the source and drain regions.

* * * * *